US007544389B2

(12) United States Patent
Dussarrat et al.

(10) Patent No.: US 7,544,389 B2
(45) Date of Patent: Jun. 9, 2009

(54) PRECURSOR FOR FILM FORMATION AND METHOD FOR FORMING RUTHENIUM-CONTAINING FILM

(75) Inventors: Christian Dussarrat, Tsukuba (JP); Kazutaka Yanagita, Tsukuba (JP); Julien Gatineau, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 11/576,209

(22) PCT Filed: Sep. 26, 2005

(86) PCT No.: PCT/IB2005/002833

§ 371 (c)(1),
(2), (4) Date: Oct. 3, 2007

(87) PCT Pub. No.: WO2006/035281

PCT Pub. Date: Apr. 6, 2006

(65) Prior Publication Data

US 2008/0038465 A1    Feb. 14, 2008

(30) Foreign Application Priority Data

Sep. 28, 2004   (JP)   .............................. 2004-281468

(51) Int. Cl.
*C23C 16/00* (2006.01)

(52) U.S. Cl. .................................. 427/248.1; 427/126.5
(58) Field of Classification Search .............. 427/248.1, 427/126.5
See application file for complete search history.

(56) References Cited

U.S. PATENT DOCUMENTS 5,378,492 A    1/1995   Mashiko et al.
2002/0004293 A1   1/2002   Soininen et al.

OTHER PUBLICATIONS

International Search Report for PCT/IB2005/002833.
Patent Abstracts of Japan, vol. 2000, No. 06, Sep. 22, 2000 & JP 2000 083929, Mar. 28, 2000.
Yuan, Z. et al. "*Low-temperature chemical vapor deposition of ruthenium dioxide from ruthenium tetroxide: A simple approach to high-purity $RuO_2$ films*", Chemistry of Materials, American Chemical Society, Washington, US, vol. 5, No. 7, Jul. 1993, pp. 908-910.

*Primary Examiner*—Roberts P Culbert
(74) *Attorney, Agent, or Firm*—Brandon S. Clark

(57) ABSTRACT

Precursor for ruthenium film deposition, comprising ruthenium tetroxide dissolved in at least one non-flammable solvent, preferably a fluorinated solvent having the general formula $C_xH_yF_zO_tN_u$ wherein:
$2x+2 \leq y+z$
and $2 \leq x \leq 15$
and $z > y$
and $t+u \geq 1$ ($t+u$ preferably equal to 1)
x, y, and z being positive integers equal to or greater than 1, t and u being integers greater than or equal to zero.

17 Claims, 4 Drawing Sheets

PRECURSOR FOR FILM FORMATION AND METHOD FOR FORMING RUTHENIUM-CONTAINING FILM

BACKGROUND

This invention relates to a precursor for ruthenium containing film formation or film deposition on a substrate (hereafter referred to as a ruthenium containing film formation precursor) and a method for forming ruthenium-containing film.

Ruthenium and ruthenium compounds such as ruthenium oxide are the materials considered most promising for the capacitor electrode materials of next generation DRAMs. High dielectric constant materials such as alumina, tantalum pentoxide, hafnium oxide, and barium-strontium titanate (BST) are currently used for these capacitor electrodes. These materials, however, are produced using temperatures as high as 600° C., which results in oxidation of polysilicon, silicon, and aluminum and causes a loss of capacitance. Both ruthenium and ruthenium oxide, on the other hand, exhibit a high oxidation resistance and high conductivity and are suitable for application as capacitor electrode materials. They also function effectively as oxygen diffusion barriers. Ruthenium has also been proposed for the gate metal for lanthanide oxides. In addition, ruthenium is more easily etched by ozone and by a plasma using oxygen than is platinum and other noble metal compounds. The use of ruthenium as a barrier layer separating low-k material from plated copper and as a seed layer has also been attracting attention recently.

The inventors have discovered that high-quality films of ruthenium and ruthenium oxide ($RuO_2$) can be deposited under appropriate conditions from a precursor of high-purity ruthenium tetroxide ($RuO_4$). This precursor can also be used for the deposition (film formation) of perovskite-type materials, such as strontium ruthenium oxide, that exhibit an excellent conductivity and a three-dimensional structure very similar to that of barium-strontium titanate and strontium titanium oxide.

However, this high-purity ruthenium tetroxide, being a strong oxidizing agent, is considered to have a high toxicity. In addition, high-purity ruthenium tetroxide has a boiling point of about 130° C. and presents an explosion risk at high temperatures (above about 108° C.). It is therefore recommended that pure ruthenium tetroxide be stored at low temperatures in order to avoid its potential for decomposition (explosion).

Given these properties of ruthenium tetroxide ($RuO_4$) (particularly the explosion risk during holding), when used as a reactant it is held diluted in an appropriate solvent. Water, carbon tetrachloride, and alkanes, for example, are known for use as this solvent.

In the case of water, however, a stabilizer such as $NaIO_4$ must be added in order to prevent $RuO_4$ from reacting and decomposing during holding. The use of such an aqueous $RuO_4$ solution as a film formation precursor for production of the films under consideration results in the introduction of impurities into the film and the tool (e.g., reaction chamber).

The electronics industry is abandoning carbon tetrachloride due to its high toxicity.

Alkanes such as pentane and octane are good solvents for $RuO_4$, but reaction between the solvent (for example, pentane) and $RuO_4$ causes the incorporation of carbon when alkane containing dissolved $RuO_4$ is used as a film formation precursor in film production. Carbon causes an increase in the resistance of ruthenium-type films, and as a consequence the presence of carbon during film production is a critical issue.

SUMMARY OF THE INVENTION

This invention provides a film formation precursor that is extremely useful for the production of ruthenium-containing films, that does not present an explosion risk during storage or holding, and that does not undergo decomposition in the absence of a stabilizer.

This invention also provides film formation methods that achieve the highly reproducible deposition of ruthenium-containing film (for example, ruthenium film, ruthenium oxide film, ruthenate film) on a substrate by a safe and simple procedure in which at least the aforementioned film formation precursor is admitted in gaseous form into a reaction chamber that holds the substrate.

According to this invention there is provided a precursor for ruthenium containing film formation, comprising ruthenium tetroxide dissolved in at least one non-flammable solvent, preferably a fluorinated solvent having the general formula $C_xH_yF_zO_tN_u$ wherein:
$2x+2 \leq y+z$
and $2 \leq x \leq 15$
and $z > y$
and $t+u \geq 1$
x, y, and z being positive integers equal to or greater than 1, t and u being integers greater than or equal to zero.

Preferably the non flammable fluorinated solvent is selected from the group comprising 3-ethoxyperfluoro(2-methylhexane) and Tris(heptafluoropropyl)amine.

According to this invention there is also provided a method for forming ruthenium-containing film, said method comprising the steps of:

depositing a ruthenium-containing film on a substrate by introducing at least a precursor for film formation disclosed hereabove into a reaction chamber that contains at least one substrate, wherein said precursor is introduced in gaseous form.

Preferably, this method also comprises the steps of:

introducing a gaseous reducing agent into the reaction chamber and thereby depositing ruthenium on at least one substrate by reacting said gaseous precursor with the gaseous reducing agent.

The reducing agent is preferably hydrogen.

The pressure in the reaction chamber shall be preferably maintained between 0.01 torr to 1000 torr., while the film deposition step is carried out at a substrate temperature comprised between 50° C. to 800° C.

Preferably the reducing agent and the ruthenium precursor are simultaneously introduced into the reaction chamber.

The method according to the invention may additionally comprise the steps of introducing the gaseous precursor into the reaction chamber, purging the reaction chamber by injecting an inert gas into it thereafter, introducing the gaseous reducing agent into the reaction chamber;

purging the reaction chamber by injecting an inert gas into it.

thereby reducing the ruthenium oxide on the substrate.

The method according to the invention may further comprise the steps of repeating the introduction step of the gaseous precursor i.e. until the desired film thickness is achieved;

Preferably the deposition of ruthenium on a substrate shall be carried out while maintaining the substrate temperature between 100° C. to 600° C.

According to another aspect, the invention may comprise the step of thermally decomposing the gaseous precursors and thereby depositing a ruthenium oxide film on the substrate.

The total pressure in the reaction chamber shall be preferably maintained between 0.01 torr to 1000 torr, while the substrate temperature shall be preferably maintained above at least 150° C.

According to another embodiment of the invention there is further provided a method for forming ruthenate films, said method comprising the steps of:
- introducing simultaneously or in separate pulses the gaseous precursor, a gaseous organometallic compound and an oxygen containing gas into the reaction chamber that holds a substrate and
- reacting said precursor, organometallic compound, and said oxygen containing gas, thereby depositing a ruthenate film on the surface of the substrate.

According to the invention, a non flammable solvent is preferably used because non flammable solvents are preferred when the mixture is used in an environment above room temperature. However, there are uses of these precursors where the process is performed at relative low temperature and wherein flammable solvents may be tolerated usually not highly flammable solvents, but only weakly flammable solvent.

According to the invention, a non-flammable solvent will be a solvent having a flash point of at least 40° C. preferably of at least 80° C. For some uses, non fluorinated solvents may be appropriate as long as they are non-flammable.

The solvent choice, particularly if distribution of the product is made through bubbling, may be (while not necessarily) key to the invention.

Preferably, the solvent used shall be non flammable in order to avoid any risks of bringing carbon into the film deposited on the substrate. This is why preferably, fluorinated solvents will be used, because the presence of fluorine in the molecule makes it usually non flammable, while at the same time no negative effect of fluorine is encountered in most applications.

It is also preferred that, in addition to non flammability, the solvent used has a vapor pressure which is substantially equal to the vapor pressure of the precursor, namely the ruthenium precursor, particularly when the precursor and its solvent, in liquid state, are provided to the reactor by bubbling an inert dry gas at "electronic" purity such as nitrogen, argon, helium or the like through it: the inert gas is thereby more or less saturated with the precursor and the solvent. If the vapor pressure of those two liquids are too different, this may create a progressive depletion of the more volatile component thereby changing the ratio precursor/solvent during time.

By "substantially equal" is meant a vapor pressure difference between the precursor and the solvent which is not greater than 20%, preferably not greater than 5% in a temperature range between 0° C. and 80° C., preferably 0° C. and 50° C. Ideally, these vapor pressures are the same.

Regarding the substrate on which ruthenium films, or ruthenium oxide films or ruthenate films can be deposited, they may be of different nature and shape:

They may be semi-conductor substrates (whether or not already covered by different layers of materials as is currently done during semi-conductors manufacturing), ceramic substrates (such as silicon dioxide or the like), metallic substrates, polymer substrates, ... etc.

They may also have different shapes such as a flat surface (wafer, ceramic substrate for hybrid circuits, ... etc.) and/or a bumped and/or a ball shaped surface, including nano-particles, and any type of materials characterized by a large specific surface.

The film formation precursors according to the invention are described in detail hereinbelow, along with the methods for forming ruthenium-containing film (for example, ruthenium film, ruthenium oxide film or ruthenate film).

1) The Film Formation Precursor

The film formation precursor is ruthenium tetroxide ($RuO_4$) dissolved preferably in a non flammable solvent, preferably a fluorinated solvent with the general formula $$C_xH_yF_zO_tN_u \quad (1)$$

wherein
2x+2≦y+z, and
2≦x≦15
z>y, and
t+u≧1.
x, y, and z being positive integers equal to or greater than 1, t and u being integers greater than or equal to zero.

A non-flammable solvent, preferably a fluorinated solvent with the aforementioned general formula can be exemplified by 3-ethoxyperfluoro(2-methylhexane). Particularly preferred for this fluorinated solvent is 3-ethoxy-1,1,1,2,3,4,4,5,5,6,6,6-dodecafluoro-2-trifluoromethylhexane ($C_3F_7CF(OC_2H_5)CF(CF_3)_2$). This particular fluorinated solvent, a fluoroether, is commercially available, for example, from the 3M Company under the tradename Novec HFE-7500. This 3-ethoxy-1,1,1,2,3,4,4,5,5,6,6,6-dodecafluoro-2-trifluoromethylhexane is preferred because it does not deplete the ozone layer and does not contribute to smog formation.

A non-flammable solvent, preferably a fluorinated solvent with the aforementioned general formula can be also exemplified by tris(heptafluoropropyl)amine. Particularly preferred for this fluorinated solvent is tris(heptafluoropropyl)amine($(C_3F_7)_3N$). This particular fluorinated solvent is also commercially available under the tradename Fluorinert FC-3283 from the 3M Company. and has very limited adverse impact on environment.

The $RuO_4$ concentration of the film formation precursor according to the invention is suitably selected as a function of the film formation conditions and the material of the substrate on which the film will be formed.

The film formation precursor according to the invention offers the following advantages.

(a) $RuO_4$ in pure form poses an explosion risk or the dissolution of $RuO_4$ in a fluorinated solvent the inventive precursor enables $RuO_4$ to be handled in a stable form without risk of explosion during storage or holding.

(b) The non-flammable solvent, preferably a fluorinated solvent in the inventive film formation precursor does not react with $RuO_4$ and can therefore avoid the $RuO_4$ decomposition that occurs with the use of water. This enables stable long-term holding (storage) of the film formation precursor.

In addition, since this film formation precursor does not exhibit an absorption spectrum in the UV-visible region, the $RuO_4$ concentration can be easily evaluated visually or by absorption spectroscopic analysis.

(c) The A non-flammable solvent, preferably a fluorinated solvent (for example, the 3-ethoxy-1,1,1,2,3,4,4,5,5,6,6,6-dodecafluoro-2-trifluoromethylhexane, available under the Novec HFE-7500 trademark from the 3M Company or tris (heptafluoropropyl)amine, whose commercial name is Fluorinert FC-3283), in the inventive film formation precursor have a vapor pressure that is very similar to that of $RuO_4$ over a broad temperature range, as shown in FIG. 1. This means that ruthenium-containing films of uniform thickness that are free of lot-to-lot variations in film thickness can be formed by converting the inventive film formation precursor to gaseous form and carrying out film formation by thermal CVD or ALD.

In other words, if a significant difference in vapor pressure between the solvent and $RuO_4$ were to exist for a film formation precursor formed by dissolving $RuO_4$ in solvent (for example, if the vapor pressure of $RuO_4$ were lower than that of the solvent) and if under these circumstances such a precursor were to be transported to the specified reaction chamber in gaseous form by bubbling with a carrier gas, in the initial phase of precursor gasification the solvent (more volatiles) would be preferentially evaporated and the carrier gas delivery would contain a lower concentration of $RuO_4$. In a later phase, carrier gas containing a higher concentration of $RuO_4$ gas would be delivered. If, for example, a ruthenium-containing film is being formed on a plurality of treatment substrates by a single-wafer procedure using a constant thermal CVD processing time, this situation would result in a thinner ruthenium-containing film on the substrate surface in the initial phase and in a thicker ruthenium-containing film on the substrate surface in the later phase, producing lot-to-lot scatter in the value of the film thickness.

By having the $RuO_4$ and a non-flammable solvent, preferably a fluorinated solvent exhibiting very similar vapor pressures over a broad temperature range as in the case of the inventive film formation precursor, the feed of this precursor to the reaction chamber by bubbling with carrier gas results in the delivery to the reaction chamber of carrier gas containing a constant concentration of $RuO_4$ gas from the initial to later phase. As a consequence, the thickness of the ruthenium-containing film can be made lot-to-lot uniform even when, as specified above, film formation is carried out on a plurality of treatment substrates by a single-wafer procedure. In addition, transport of the $RuO_4$ gas-containing carrier gas no longer requires complex efforts at precursor concentration management.

(d) The desired ruthenium-containing film can in fact be produced since the non-flammable solvent, preferably a fluorinated solvent in the inventive film formation precursor does not react with $RuO_4$ when this precursor is used in gaseous form to produce film by thermal CVD. Thus, when the film formation precursor is formed by dissolution of $RuO_4$ in water and film formation by thermal CVD is carried out by delivering such a precursor in gaseous form to a reaction chamber, the $RuO_4$ undergoes decomposition with the production of active Ru and this active Ru reacts with the water, producing unwanted oxide. This makes it quite difficult to produce the desired ruthenium-containing film.

In the case of the inventive film formation precursor, the non-flammable solvent does not react with the active Ru compounds produced when $RuO_4$ decomposes in the reaction chamber and is discharged from the reaction chamber along with unreacted gas. This makes it possible to obtain the desired ruthenium-containing film unmodified with unwanted compounds such as oxides.

(e) The non-flammable solvent in the inventive film formation precursor is preferably not toxic. This makes it possible to implement film production in a safe environment when ruthenium-containing film is produced by thermal CVD using the gaseous inventive film formation precursor.

(f) The fluorinated solvent in the inventive film formation precursor is preferably non flammable and exhibits a high thermal stability, which makes it possible—when this film formation precursor is used in gaseous form for the production of ruthenium-containing film by thermal CVD—to avoid incorporation of carbon into the film as well as decomposition, combustion, or explosion by the solvent.

The stability of the inventive film formation precursor during holding (storage) is confirmed by the following test.

An $RuCl_3 \cdot nH_2O$ solution and $Ce(NO_3)_4 \cdot 2NH_4NO_3$ were mixed so as to provide an 8-fold molar concentration of Ru and were reacted; this was followed by extraction at room temperature with 3-ethoxy-1,1,1,2,3,4,4,5,5,6,6,6-dodecafluoro-2-trifluoromethylhexane (Novec HFE-7500, trademark of the 3M Company) using a separatory funnel. After separation of the water and HFE-7500 phases, the HFE-7500 solution was held at some test temperature in the dark at 40° C. and the $RuO_4$ concentration was determined periodically by UV-visible spectrometry. UV-visible spectrometric analysis (590 nm) was carried out by mixing 1 mol/L NaSCN into the HFE-7500 solution provided by the periodic sampling. The results are reported in FIG. 2. FIG. 2 shows the relationship between the $RuO_4$ concentration and the storage time (in the dark at 40° C.) of the HFE-7500 solution containing dissolved $RuO_4$.

The results in FIG. 2 confirm that an HFE-7500 solution containing $RuO_4$ dissolved in a concentration of 0.12 weight % (0.3 mole %), that is, a solution corresponding to the film formation precursor according to the invention, is capable of stable long-term storage in the dark at 40° C.

In addition, during use of a film formation precursor comprising $RuO_4$ dissolved in HFE-7500, the UV signal was measured from $RuO_4$ gas discharged on different days (for example, days 8, 18, 24, 39, and 45) from a bubbler at room temperature and 85 torr using nitrogen carrier gas. The same ultraviolet signal strength was obtained regardless of the day of measurement, which confirmed that the film formation precursor was capable of stable long-term delivery.

(2) The Method for Forming Ruthenium-containing Film

Ruthenium-containing film is formed by depositing ruthenium-containing film on a substrate by introducing, in gaseous form, at least the inventive film formation precursor into a reaction chamber that holds the substrate.

Among possible ruthenium-containing films, the following are specifically described hereinbelow:
2-1) a method for forming ruthenium film,
2-2) a method for forming ruthenium oxide film ($RUO_2$ film), and
2-3) a method for forming ruthenate film.

2-1) Method for Forming Ruthenium Film

Ruthenium film is formed by introducing the inventive film formation precursor in gaseous form and gaseous reducing agent into a reaction chamber that holds a substrate and depositing ruthenium on the substrate by reacting the precursor with the reducing agent.

The inventive film formation precursor can be introduced into the reaction chamber using a bubbler system. That is, the inventive film formation precursor, being a liquid as noted above, can be held within a vessel and an inert gas (e.g., nitrogen, argon, helium, etc.) can be bubbled into this (possibly temperature controlled) vessel using an inert gas bubbling tube, resulting in delivery into the reaction chamber of the inventive precursor entrained in the inert gas. The invention is certainly not limited to a bubbler system, and a liquid mass flow controller/evaporator combination can also be used.

The reducing agent under consideration reduces ruthenium oxide to ruthenium metal. This reducing agent can be specifically exemplified by hydrogen ($H_2$), but is not limited thereto. A single reducing agent or the combination of two or more reducing agents can be used. Hydrogen is particularly preferred for the reducing agent.

Chemical vapor deposition (CVD) and atomic layer deposition (ALD) can be used to form the ruthenium film.

When CVD is used, the gaseous reducing agent and gaseous film formation precursor according to the invention are introduced simultaneously in the reaction chamber. In this case the reducing agent and $RuO_4$ in the precursor react in the gas phase, resulting in reduction of the $RuO_4$ to ruthenium, which deposits on the substrate. The hereinabove specified non-flammable solvent, preferably a fluorinated solvent that accompanies the $RuO_4$ in the gaseous precursor does not undergo decomposition during this ruthenium deposition, and its incorporation into the ruthenium film is therefore also avoided.

The total pressure in the reaction chamber during this film production is preferably maintained at 0.01 torr to 1000 torr and is more preferably maintained at 0.1 torr to 10 torr. The substrate is preferably heated to 50° C. to 800° C. and is more preferably heated to 100° C. to 400° C. The reducing agent is admitted into the reaction chamber in sufficient quantity to reduce the $RuO_4$ in the precursor to ruthenium metal. When, for example, hydrogen is used as the reducing agent, at least 4 moles hydrogen are used per 1 mole $RuO_4$ in the precursor. The by-product in this case is $H_2O$.

In the case of ALD, only the gaseous film formation precursor (in terms of the reactive compounds involved, that is, the $RuO_4$ in the precursor and the reducing agent) is initially introduced into the reaction chamber and a very thin layer (monoatomic layer) of ruthenium oxide is formed on the substrate by adsorption and decomposition of the precursor. The interior of the reaction chamber is then purged with an inert gas (e.g., nitrogen, helium) in order to remove unreacted (unabsorbed) film formation precursor—including the hereinabove specified non-flammable solvent, preferably a fluorinated solvent accompanying the $RuO_4$ in the gaseous precursor. This purge is followed by the introduction of only the gaseous reducing agent into the reaction chamber. The incoming reducing agent reacts with the monoatomic layer of ruthenium oxide formed on the substrate and reduces the ruthenium oxide to ruthenium metal. This results in the formation of a monoatomic layer of ruthenium on the substrate. When the elaboration of a thicker ruthenium film is desired, the following sequence can be repeated after the unreacted reducing agent and gaseous reaction products generated by the reducing agent have been purged from the reaction chamber: introduction of the gaseous film formation precursor according to the invention, purge/removal of the residual film formation precursor, introduction of the reducing agent, purge/removal of reducing agent and gaseous reaction products.

Introduction of the gaseous film formation precursor and reducing agent can be carried out by pulse delivery in the case of ALD. The gaseous film formation precursor can be introduced, for example, for 0.01 second to 10 seconds at a flow rate of 0.1 sccm to 10 sccm and the reducing agent can be introduced, for example, for 0.01 second at a flow rate of 0.5 sccm to 100 sccm. The purge gas can also be introduced, for example, for 0.01 second to 10 seconds at a flow rate of 100 sccm to 5000 sccm.

The total pressure in the reaction chamber during ALD is preferably maintained at 0.1 torr to 10 torr, while the substrate temperature is preferably maintained at 100° C. to 600° C.

2-2) Method for Forming Ruthenium Oxide Film ($RuO_2$ Film)

The inventive film formation precursor is introduced in gaseous form into a reaction chamber that holds a substrate. This film formation precursor can be introduced into the reaction chamber in gaseous form by a bubbler system as described above. In this case the substrate is heated to a temperature at which the $RuO_4$ in the precursor is decomposed and solid ruthenium oxide (ruthenium dioxide) is produced. The solid ruthenium oxide produced by $RuO_4$ decomposition deposits on the substrate. The hereinabove specified fluorinated solvent that accompanies the $RuO_4$ in the gaseous precursor does not undergo decomposition during this deposition of ruthenium oxide, and its incorporation into the ruthenium oxide film is therefore also avoided. The solid ruthenium oxide ($RuO_2$) functions as a decomposition catalyst for the gaseous $RuO_4$. As a result, once the gaseous $RuO_4$ has been decomposed under the application of heat and solid ruthenium oxide produced by this decomposition has deposited on the substrate, the gaseous $RuO_4$ can be satisfactorily decomposed even when the heating temperature is reduced.

The total pressure within the reaction chamber during this ruthenium oxide deposition is preferably set at 0.01 torr to 1000 torr and more preferably is set at 0.1 to 5 torr. The substrate is preferably heated to at least 150° C. and more preferably is heated to 350° C. to 400° C.

The substrate submitted to the film formation methods described above under 2-1) and 2-2) can be exemplified by semiconductor substrates such as silicon substrates. The following, for example, may be formed on this semiconductor substrate: low-k film, high-k film, C-doped silicon dioxide film, titanium nitride film, copper film, tantalum nitride film, molybdenum film, tungsten film, and ferroelectric film. The ruthenium films and ruthenium oxide films afforded by this invention exhibit an excellent adherence to these films and will not debond even when submitted to chemical mechanical polishing (CMP). Moreover, the incorporation of impurities, such as carbon and halogens such as fluorine, is entirely absent from these ruthenium films, ruthenium oxide or ruthenium-containing films. In addition, an incubation period is either unnecessary in the present invention or is very brief, which enables deposition (growth) of the ruthenium films and ruthenium oxide films in a correspondingly shorter period of time (from the initial early phase in the case of ALD, several minutes for CVD).

FIG. 3 contains a schematic drawing that illustrates an example of an apparatus that can be used to implement methods 2-1) and 2-2) by CVD.

The apparatus illustrated in FIG. 3 is provided with a reaction chamber 11, a feed source 12 for the film formation precursor, a feed source 13 for reducing agent gas, and a feed source 14 for an inert gas as typically used as a carrier gas and/or diluent gas. In the case of a single-wafer tool, a susceptor (not shown) is provided in the reaction chamber 11 and a single semiconductor substrate (not shown), such as a silicon substrate, is mounted on the susceptor. The interior of the susceptor is provided with a heater for heating the semiconductor substrate to the prescribed reaction temperature. In the case of a batch tool, from 5 to 200 semiconductor substrates are held in the reaction chamber 11. The heater in a batch tool may have a different structure from that of the heater in a single-wafer tool.

The feed source 12 for the film formation precursor introduces the film formation precursor into the reaction chamber 11 using the bubbler system already described above and is connected to the inert gas feed source 14 by a line L1. The line L1 is provided with a shutoff valve V1 and downstream therefrom with a flow rate controller, for example, a mass flow controller MFC1. The film formation precursor is introduced into the reaction chamber 11 from the feed source 12 through a line L2. The following are provided in the line L2 considered from the upstream side: a UV spectrometer UVS, a pressure gauge PG1, a shutoff valve V2, and a shutoff valve V3. The UV spectrometer UVS functions to confirm the presence and detect the concentration of the precursor (particularly the $RuO_4$) in the line L2.

The feed source 13 for the reducing agent gas comprises a vessel that holds the reducing agent in gaseous form. The reducing agent gas is admitted into the reaction chamber 11 from this feed source 13 through a line L3. A shutoff valve V4 is provided in the line L3. The line L3 is connected to the line L2.

The inert gas feed source 14 comprises a vessel that holds inert gas in gaseous form. Inert gas can be introduced from this feed source into the reaction chamber 11 through a line L4. The following are provided in the line L4 considered from the upstream side: a shutoff valve V6, a mass flow controller MFC3, and a pressure gauge PG2. The line L4 joins with the line L3 upstream from the shutoff valve V4. The line L1 branches off the line L4 upstream from the shutoff valve V6.

A line L5 branches from the line L1 upstream from the shutoff valve V1. This line L5 joins into the line L2 between the shutoff valves V2 and V3. A shutoff valve V7 and a mass flow controller MFC4 are disposed in the line L5 in the given sequence from the upstream side.

A line L6, which reaches to the reaction chamber 11, branches off between the shutoff valves V3 and V4. A shutoff valve V8 is provided in this line L6.

A line L7, which reaches to a pump PMP, is provided at the bottom of the reaction chamber 11, and the following are provided in this line L7 considered from the upstream side: a pressure gauge PG3, a butterfly valve BV for adjusting the back pressure, and a hot trap 15. The hot trap 15 comprises a tube that is provided over its circumference with a heater. Since the $RuO_4$ in the gaseous precursor is converted into solid ruthenium oxide by thermal decomposition, the $RuO_4$ introduced into this hot trap 15 can be eliminated from the gas stream by conversion into solid ruthenium oxide, which deposits on the inner wall of the tube.

In order to produce ruthenium film using the apparatus illustrated in FIG. 3, the shutoff valves V1, V2, and V5 are first closed and the shutoff valves V6, V7, V3, V4, and V8 are opened. While operating the pump PMP, the inert gas from the inert gas feed source 14 are introduced into the reaction chamber 11 through the line L4 and L5 via the line L6.

The shutoff valve V5 is then opened and reducing agent gas is introduced into the reaction chamber 11 from the reducing agent gas feed source 13, followed immediately by the opening of shutoff valves V1 and V2 and the introduction of inert gas from the inert gas feed source 14 through the line L1 and into the feed source 12 for the film formation precursor. This results in the introduction of gaseous precursor ($RuO_4$ and the hereinabove specified non-flammable solvent, preferably a fluorinated solvent) into the reaction chamber 11 via the line L2 and the line L6. The reducing agent gas and $RuO_4$ react in the reaction chamber 11, resulting in the deposition of ruthenium metal on the semiconductor substrate.

In order to produce a solid ruthenium oxide film using the apparatus illustrated in FIG. 3, the apparatus is prepped by closing the shutoff valves V5 as well as V4 and V6 and keeping these valves closed since the reducing agent gas will not be used. The pump PMP is started, a vacuum condition is created, and shutoff valves V3, V7, and V8 are opened in order to have inert gas flown in the reaction chamber. While in this state, the shutoff valves V1, V2, are opened and inert gas is introduced from the inert gas feed source 14 through the line L4 and the line L1 into the feed source 12 for the film formation precursor, resulting in the introduction of gaseous precursor ($RuO_4$ and the hereinabove specified non-flammable solvent, preferably a fluorinated solvent) into the reaction chamber 11 via the line L2 and the line L6. Since the reaction chamber 11 is being heated, the $RuO_4$ introduced into the reaction chamber 11 undergoes thermal decomposition into solid ruthenium oxide, which deposits on the substrate.

FIG. 4 contains a schematic drawing that illustrates an example of an apparatus that can be used to implement the method of 2-1) (formation of ruthenium film) by ALD.

The apparatus illustrated in FIG. 4 has a structure in which a line L8 is provided in the apparatus illustrated in FIG. 3; this line L8 is itself provided with a shutoff valve V2' and, downstream from the shutoff valve V2', with a hot trap 15' that is the same as the hot trap 15. The same reference symbols have therefore been assigned to those elements that are the same as in FIG. 3, and these elements will not be described in detail again. One end of the installed line L8 is connected to the line L2 between the ultraviolet spectrometer UVS and the pressure gauge PG1, while the other end is connected to the line L7 between the hot trap 15 and the pump PMP.

In order to produce ruthenium film by ALD using the apparatus illustrated in FIG. 4, the shutoff valves V2 and V5 are first closed and the shutoff valves V6, V7, V3, V4, V8, and V9 are opened, as are the shutoff valves V1 and V2'. As the pump PMP is operating, a vacuum state is generated in the different lines in which inert gas from the inert gas feed source 14 is introduced through the line L4 and L5 and into the reaction chamber 11 via the line L6, he passage of inert gas through the line L1, the feed source 12 for the film formation precursor, resulting in the throughflow of gaseous precursor ($RuO_4$ and the hereinabove specified non-flammable solvent, preferably a fluorinated solvent) in L2 and L8, along with the inert gas.

After this initial set up has been carried out, the shutoff valve V2' is closed and the shutoff valve V2 is opened and a pulse of gaseous precursor is delivered into the reaction chamber 11. This is followed by the simultaneous closure of the shutoff valve V2 and the opening of the shutoff valve V2', which results in passage through the line L8 of gaseous precursor along with inert gas which will be decomposed in hot-trap 15'. A purge of the reaction chamber interior by the introduction into the reaction chamber 11 of inert gas from L4 and L5 via L6 leading to the removal of unreacted precursor (including the non-flammable solvent, preferably a fluorinated solvent) and generated by-products from the interior of the reaction chamber 11. The shutoff valve V5 is then opened and a pulse of reducing agent gas is delivered from the reducing agent gas feed source 13 along with inert gas from the inert gas feed source 14 into the reaction chamber 11. This is followed by closure of the shutoff valve V5, resulting in the delivery of a pulse of inert gas into the reaction chamber 11 and removal of reaction by-products, unreacted reducing agent, etc., from the reaction chamber 11. This process cycle can be repeated until a ruthenium film with the desired thickness is obtained.

2-3) Method for Forming Ruthenate Film

Ruthenate film is formed by introducing the hereinabove specified film formation precursor in gaseous form and a gaseous organometallic compound into a reaction chamber that holds a substrate and reacting the precursor and organometallic compound in the presence of an oxygenated gas and thereby depositing ruthenate on the surface of the substrate.

The film formation precursor can be introduced into the reaction chamber by a bubbler system as described above.

When, for example, a ferroelectric film of $BaRuO_x$ is to be produced, $Ba(DPM)_2$, which is a β-diketone/barium complex, can be used as the organometallic compound. When a ferroelectric film of $SrRuO_x$ is to be produced, $Sr(DPM)_2$, which is β-diketone/strontium complex, can be used as the organometal compound. Here, DPM is an abbreviation for dipivaloylmethanate or 2,2,6,6-tetramethyl-3,5-heptanedionate (TMHD).

The oxygenated gas can be, for example, oxygen, ozone or $N_2O$.

CVD can be used to form the ferroelectric films mentioned above, in which case the hereinabove specified film formation precursor in gaseous form and the organometallic metal in gaseous form are introduced into the reaction chamber. The $RuO_4$ in the precursor and the organometallic compound then react in the gas phase in the presence of oxygen, resulting, for example, in the formation of $BaRuO_x$ (or $SrRuO_x$) and its deposition on the substrate. At the same time, however, the hereinabove specified non-flammable solvent, preferably a fluorinated solvent accompanying the $RuO_4$ in the gaseous precursor does not undergo decomposition during deposition of the ferroelectric film, thereby also avoiding incorporation into the film.

The temperature in the reaction chamber is preferably brought to 450° C. to 800° C., which is the reaction temperature for these gases.

The ruthenate films (for example, $BaRuO_x$ and $SrRuO_x$) produced by this method exhibit ferroelectric properties and can be used, for example, in capacitors. Moreover, since thin ferroelectric films can be produced by this method, these films can be used as electrode materials just like the Ru films and $RuO_2$ films. In specific terms, these ferroelectric films (particularly $SrRuO_x$) can be used as the upper and lower electrode materials for a separate ferroelectric (or as a buffer layer between a ferroelectric and the electrode material). These ferroelectric films, being oxides, can prevent oxygen and PbO diffusion with respect to ferroelectrics such as lead lanthanate titanate (PLT) and lead zirconate titanate (PZT), and at the same time, by adopting the same perovskite structure as these ferroelectrics, can increase the adherence at the interface of the electrode material with these ferroelectrics and can prevent or lessen, inter alia, generation of the low dielectric constant layer that can occur at this interface and can prevent or lessen deterioration.

EXAMPLES

The invention is explained in greater detail below through examples, but the invention is not restricted by these examples.

Example 1

A reaction chamber was loaded with a silicon substrate and also with a silicon substrate that carried a silicon dioxide film on its surface; a container was loaded with a film formation precursor comprising ruthenium tetroxide ($RuO_4$) dissolved at a concentration of 0.12 weight % in 3-ethoxy-1,1,1,2,3,4,4,5,5,6,6,6-dodecafluoro-2-trifluoromethylhexane (Novec HFE-7500, tradename of the 3M Company); and $RuO_4$ and HFE-7500 entrained in nitrogen were introduced into the reaction chamber by bubbling nitrogen through the container. Hydrogen was also introduced into the same reaction chamber at a concentration of 0.5 volume % with reference to the nitrogen. The total pressure in the reaction chamber was set at 10 torr and the substrate temperature was brought to 300° C. Proceeding in this manner resulted in the deposition of a ruthenium metal film on both substrates. The ruthenium metal deposition rate was about 9 Å/min.

The obtained ruthenium metal film was tightly bonded to both the silicon substrate and the silicon dioxide film on the other silicon substrate.

The incubation period (time required after the start of the reaction until the onset of film formation) in this ruthenium metal deposition was 5 minutes for the silicon substrate and 7 minutes for the silicon dioxide film-surfaced silicon substrate. In contrast, the incubation period was zero when ruthenium metal was deposited using pure $RuO_4$ as precursor. Thus, this Example 1, notwithstanding an incubation period that was a little longer than for the use of pure $RuO_4$ with its explosion risk, enabled film formation to be carried out in a safe and practical manner when considered in overall terms.

The silicon dioxide film-surfaced silicon substrate coated with the ruthenium metal film was also subjected to analysis of its surface composition by Auger electron spectroscopy. The results are reported in FIG. 5. FIG. 5 reports the atomic concentration profile of each element as a function of depth from the ruthenium metal film surface. Thus, the sputtering time plotted on the x-axis in FIG. 5 corresponds to depth from the surface.

As is clear from FIG. 5, an extremely pure ruthenium film was produced and none of the impurities O, C, and F were detected.

Example 2

Ruthenium metal film was formed as described in Example 1 on the following: alumina film, low-k film, hafnium oxide ($HfO_2$) film, lanthanum oxide ($La_2O_3$) film, tantalum nitride (TaN) film, tantalum oxide ($Ta_2O_5$) film, titanium nitride (TiN), BST film, and PZT film. The ruthenium metal deposition rate was unrelated to the nature of the film and was about 9 Å/min in each case. In addition, the ruthenium metal was in all cases tightly bonded to the underlying film.

Example 3

A reaction chamber was loaded with a silicon substrate and also with a silicon substrate that carried a silicon dioxide film on its surface; a container was loaded with the same film formation precursor with a 0.12 weight % concentration as in Example 1; nitrogen was bubbled at a flow rate of 10 sccm through the container; and $RuO_4$ and HFE-7500 entrained in nitrogen were introduced into the reaction chamber for 0.5 second in such a manner that the $RuO_4$ gas flow rate was 0.07 sccm. A thin film of ruthenium oxide was formed on each substrate. After the unreacted $RuO_4$ and accompanying HFE-7500 had been removed by purging the interior of the reaction chamber with nitrogen, hydrogen was introduced for 1 second into the reaction chamber at a flow rate of 1.2 sccm along with nitrogen being used as diluent. The total flow rate of the nitrogen used as diluent was 174 sccm. The pressure within the reaction chamber was maintained at 4 torr. The substrate temperature was set at 300° C.

The interior of the reaction chamber was then purged with nitrogen, after which the cycle described above was repeated to obtain a ruthenium metal film with the desired thickness. The ruthenium metal deposition rate was about 1.9 Å/min per cycle.

The number of incubation cycles (number of cycles required after the start of the reaction until the onset of film formation) in this ruthenium metal deposition by ALD was zero for the silicon substrate and was also zero for the silicon dioxide film-surfaced silicon substrate, which indicated that efficient film production had been achieved. 75 incubation cycles were required when a ruthenium metal film was deposited by ALD using pure $RuO_4$ as precursor.

Example 4

Ruthenium metal film was formed as described in Example 3 on the following: alumina film, low-k film, hafnium oxide ($HfO_2$) film, lanthanum oxide ($La_2O_3$) film, tantalum nitride (TaN) film, tantalum oxide ($Ta_2O_5$) film, titanium nitride (TiN), BST film, and PZT film. The ruthenium metal deposition rate was unrelated to the nature of the film and was about 1.9 Å/min per cycle in each case. In addition, the ruthenium metal was in all cases tightly bonded to the underlying film.

Example 5

A reaction chamber was loaded with a silicon substrate and also with a silicon substrate that carried a silicon dioxide film on its surface; a container was loaded with the same film formation precursor with a 0.12 weight % concentration as in Example 1; nitrogen was bubbled at a flow rate of 20 sccm through the container; and $RuO_4$ and HFE-7500 entrained in nitrogen were introduced into the reaction chamber. The total pressure in the reaction chamber was set at 10 torr and the substrate temperature was 400° C. Under these conditions a very uniform ruthenium oxide film with a thickness of about 1000 Å was obtained on each substrate in 60 minutes (deposition rate=about 17 Å/min). The obtained ruthenium oxide film was tightly bonded to both the silicon substrate and the silicon dioxide film on the other silicon substrate.

Figure 1:
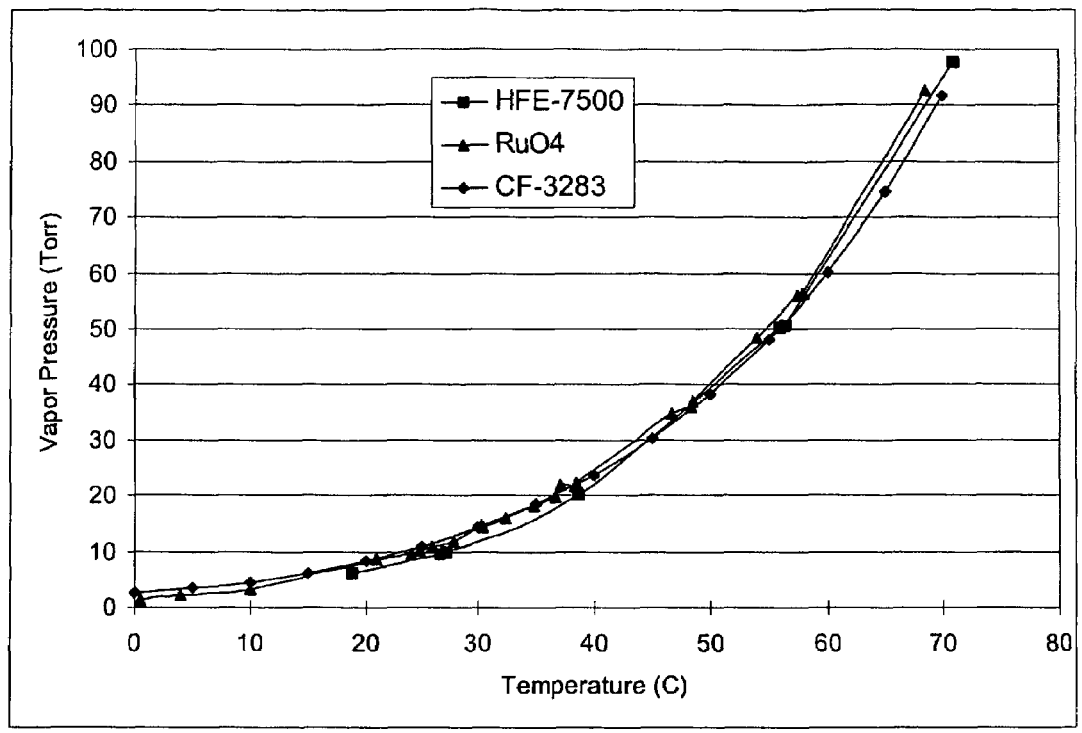
FIG. 1 is a diagram that illustrates vapor pressure versus temperature for $RuO_4$, HFE-7500 and FC-3283, which are possible components of a film formation precursor according to the invention.
Figure 2:
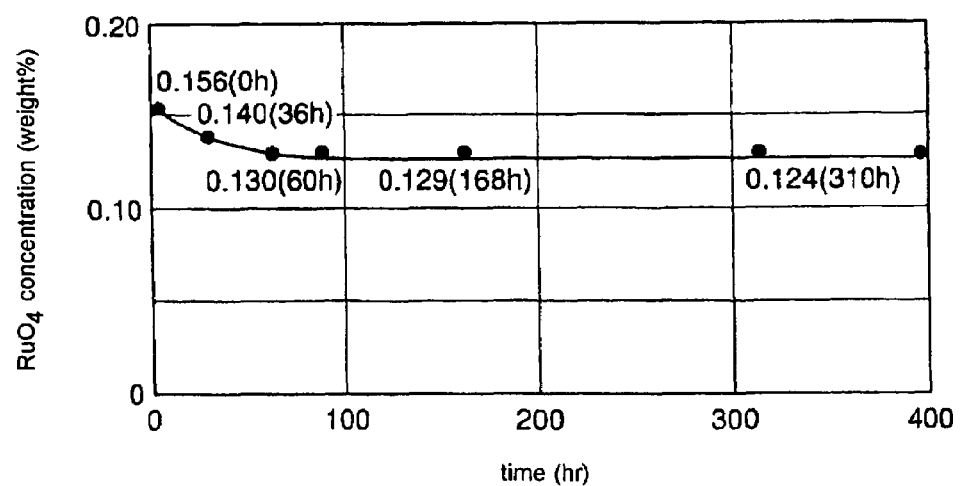
FIG. 2 is a diagram that illustrates the relationship between the $RuO_4$ concentration and the time of storage in the dark at 40° C. for an HFE-7500 solution in which $RuO_4$ is dissolved.
Figure 3:
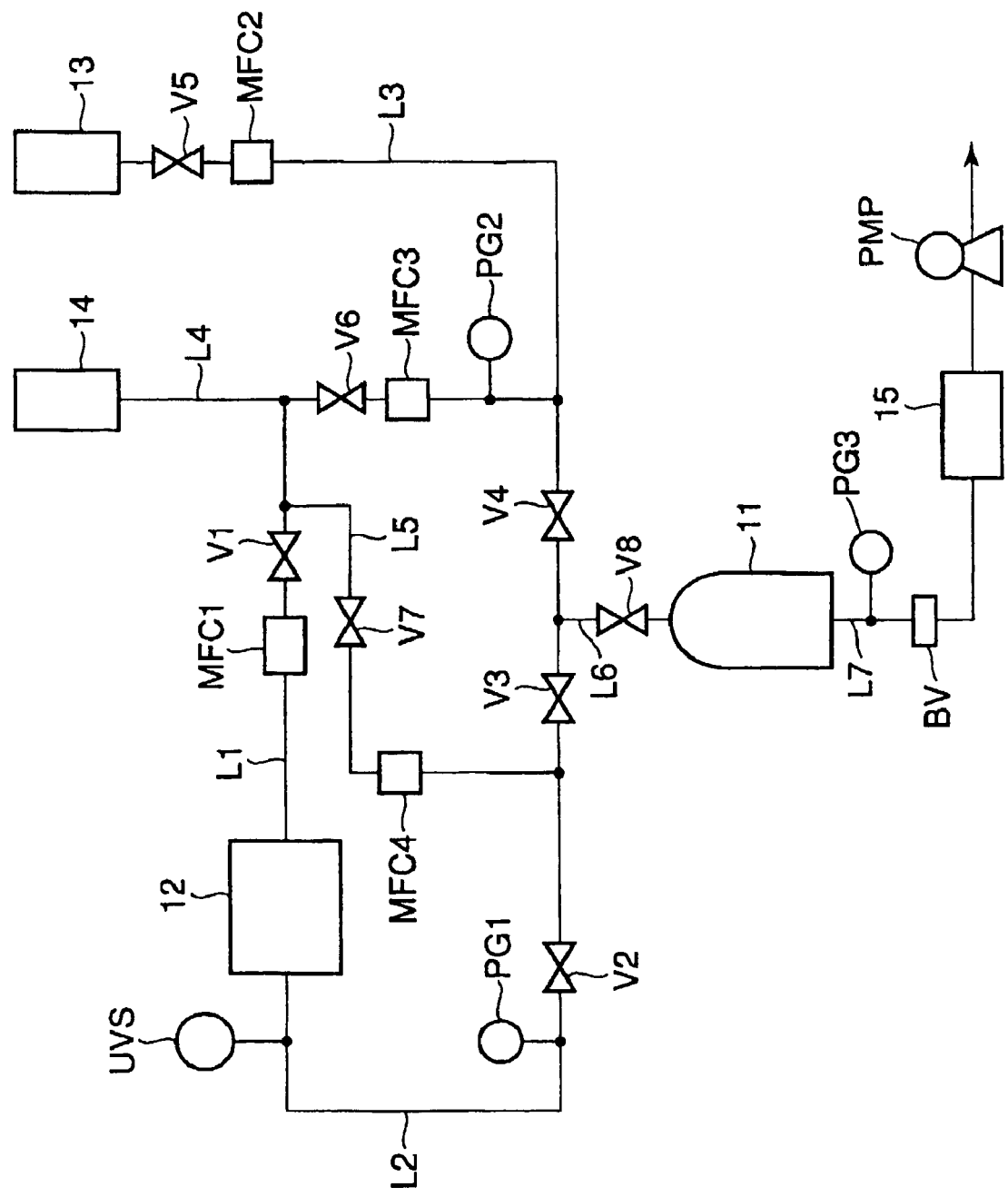
FIG. 3 is a schematic diagram that schematically illustrates an example of an apparatus for carrying out a method according to the invention.
Figure 4:
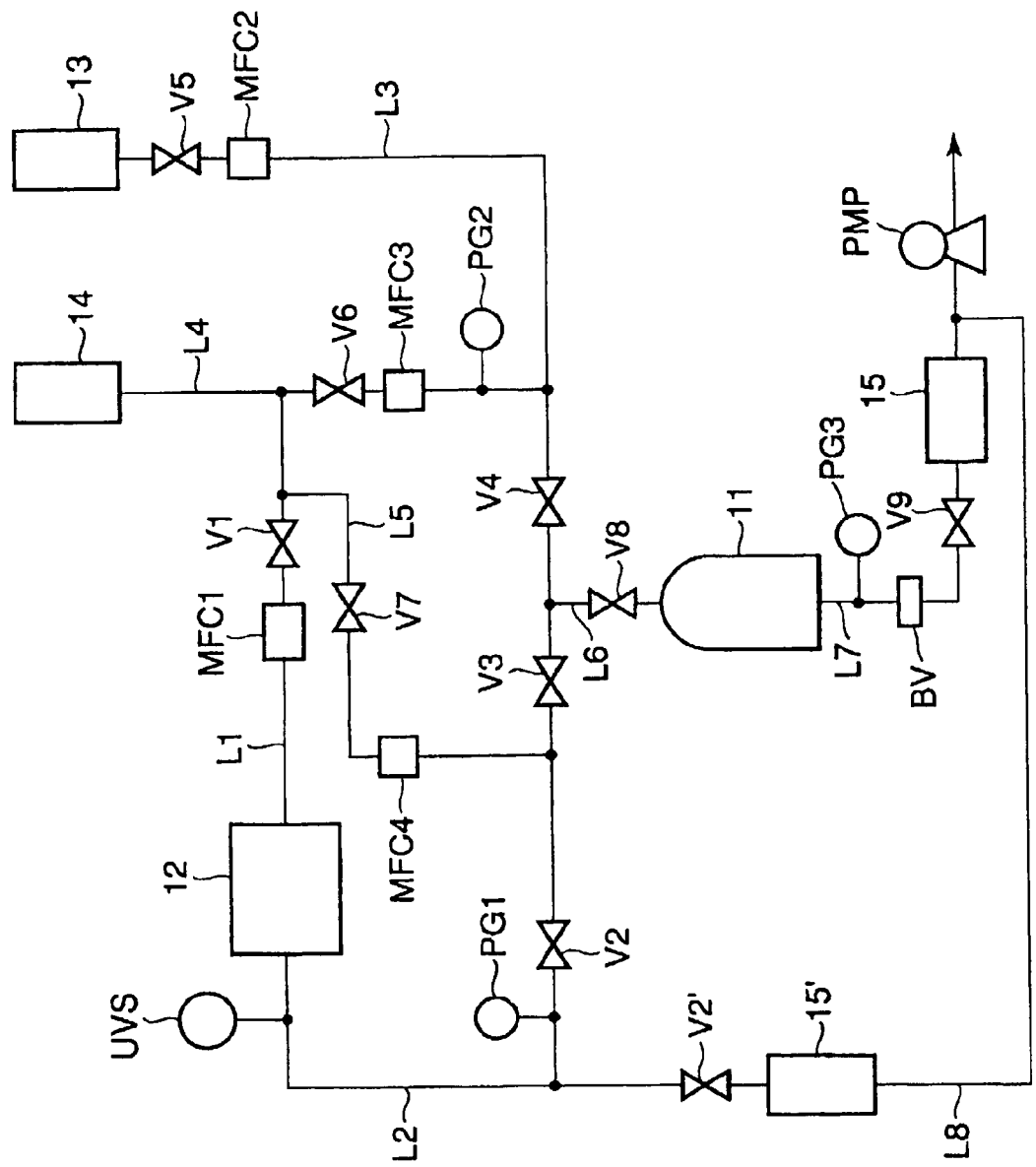
FIG. 4 is a schematic diagram that schematically illustrates another example of an apparatus for carrying out a method according to the invention.
Figure 5:
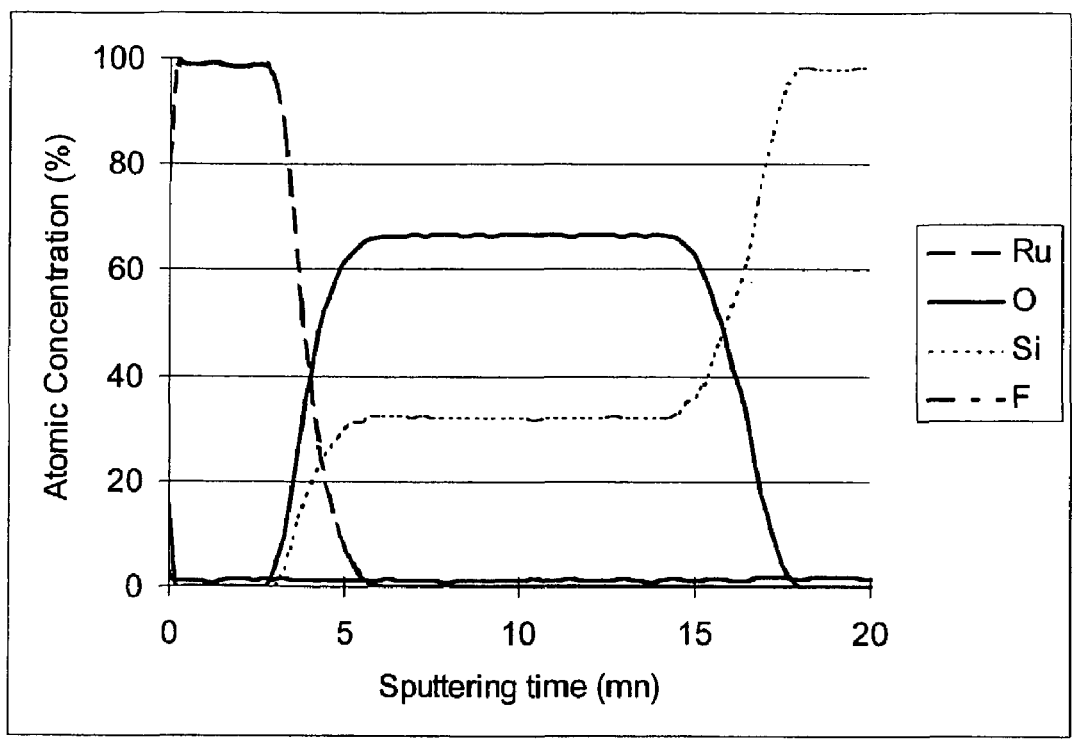
FIG. 5 is a diagram that illustrates the atomic concentration profile obtained when the silicon dioxide film-surfaced silicon substrate coated with ruthenium metal film according to Example 1 of the invention was submitted to analysis of its surface composition by Auger electron spectroscopy.

It will be understood that many additional changes in the details, materials, steps and arrangement of parts, which have been herein described in order to explain the nature of the invention, may be made by those skilled in the art within the principle and scone of the invention as expressed in the appended claims. Thus, the present invention is not intended to be limited to the specific embodiments in the examples given above.

What is claimed is:

1. A method for forming a ruthenium-containing film, comprising the steps of depositing a ruthenium-containing film on a substrate by introducing at least a precursor for film formation into a reaction chamber that contains at least one substrate, wherein said precursor is introduced in gaseous form and wherein the precursor comprises ruthenium tetroxide dissolved in non-flammable fluorinated solvent, having the general formula $C_xH_yF_zO_tN_u$ wherein:
   a) $2x+2 \leq y+z$;
   b) $2 \leq x \leq 15$;
   c) $z > y$; and
   d) $t+u \geq 1$,
x, y, and z, being positive integers equal to or greater than 1, t and u being integers greater than or equal zero, and introducing a gaseous reducing agent into the reaction chamber and thereby depositing ruthenium on at least one substrate by reacting said gaseous precursors with the gaseous reducing agent.

2. The method of claim 1, wherein the reducing agent is hydrogen.

3. The method of claim 1, wherein the pressure in the reaction chamber is maintained between 0.01 torr and 1000 torr.

4. The method of claim 1, wherein the film deposition step is carried out at a substrate temperature comprised between 50° C. to 800° C.

5. The method of claim 1, wherein the reducing agent and the ruthenium precursor are simultaneously introduced into the reaction chamber.

6. The method of claim 1, comprising the steps of:
   a) introducing the gaseous precursor into the reaction chamber;
   b) purging the reaction chamber by injecting an inert gas into it;
   c) thereafter, introducing the gaseous reducing agent into the reaction chamber during a determined duration, thereafter called reducing agent pulse; and
   d) purging the interior of the reaction chamber by injecting an inert gas into it,
thereby reducing the ruthenium oxide on the substrate.

7. The method of claim 6, further comprising the step of repeating the introduction step of the gaseous precursor, e.g. until the desired film thickness is achieved.

8. The method of claim 6, comprising the step of maintaining the substrate temperature between 100° C. and 600° C.

9. The method of claim 1, comprising the steps of:
   a) thermally decomposing the gaseous precursor; and
   b) and thereby depositing a ruthenium oxide film on the substrate.

10. The method of claim 9, comprising the step of maintaining the total pressure in the reaction chamber between 0.01 torr and 1000 torr.

11. The method of claim 9, comprising the step of maintaining the substrate temperature above at least 150° C.

12. The method of claim 1, further comprising the steps of:
a) introducing simultaneously or in separate pulses the gaseous precursor, a gaseous organometallic compound and an oxygen containing gas into the reaction chamber that holds the substrate; and
b) reacting said precursor, organometallic compound and said oxygen containing gas thereby depositing a ruthenate film on the surface of the substrate.

13. The method of claim 1, wherein the substrate is a silicon-based wafer for semi-conductor manufacture.

14. The method of claim 1, wherein the substrate is a ceramic-based material.

15. The method of claim 14, wherein the substrate is not a flat surface but comprises at least some curved surfaces such as bumps.

16. The method of claim 1, wherein the substrate is a ball-shaped substrate.

17. The method of claim 1, wherein the fluorinated solvent is selected from the group comprising 3-ethoxyperfluoro(2-methylhexane) and tris(heptafluoropropyl)amine.

* * * * *